(12) United States Patent
Chase et al.

(10) Patent No.: US 9,198,293 B2
(45) Date of Patent: Nov. 24, 2015

(54) NON-CYLINDRICAL CONDUCTING SHAPES IN MULTILAYER LAMINATED SUBSTRATE CORES

(71) Applicants: Harold R. Chase, Mesa, AZ (US); Mathew J. Manusharow, Phoenix, AZ (US); Mark S. Hlad, Chandler, AZ (US); Mihir K. Roy, Chandler, AZ (US)

(72) Inventors: Harold R. Chase, Mesa, AZ (US); Mathew J. Manusharow, Phoenix, AZ (US); Mark S. Hlad, Chandler, AZ (US); Mihir K. Roy, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/743,252

(22) Filed: Jan. 16, 2013

(65) Prior Publication Data

US 2014/0197545 A1   Jul. 17, 2014

(51) Int. Cl.
| | |
|---|---|
| H01L 23/48 | (2006.01) |
| H05K 1/16 | (2006.01) |
| H05K 1/02 | (2006.01) |
| H01L 23/498 | (2006.01) |
| H01L 23/552 | (2006.01) |
| H01L 23/64 | (2006.01) |

(52) U.S. Cl.
CPC .......... *H05K 1/165* (2013.01); *H01L 23/49822* (2013.01); *H01L 23/49827* (2013.01); *H01L 23/552* (2013.01); *H01L 23/645* (2013.01); *H05K 1/0222* (2013.01); *H01L 2223/6622* (2013.01); *H01L 2224/16225* (2013.01); *H01L 2224/73253* (2013.01); *H01L 2924/15311* (2013.01)

(58) Field of Classification Search
CPC .............. H01L 23/481; H01L 23/5226; H01L 23/5227; H01L 23/645; H01L 23/49827; H01L 23/49822
USPC .................... 257/276, 277, 531, 774
See application file for complete search history.

(56) References Cited

U.S. PATENT DOCUMENTS

| | | | |
|---|---|---|---|
| 2008/0296751 A1* | 12/2008 | Fan ................................. | 257/693 |
| 2012/0181508 A1* | 7/2012 | Chang et al. .................... | 257/29 |
| 2012/0306608 A1* | 12/2012 | Takenaka ....................... | 336/200 |
| 2013/0032389 A1* | 2/2013 | Tokura et al. .................. | 174/264 |
| 2014/0001597 A1* | 1/2014 | Huang et al. ................... | 257/531 |

* cited by examiner

*Primary Examiner* — Tan N Tran
(74) *Attorney, Agent, or Firm* — Blakely, Sokoloff, Taylor & Zafman LLP

(57) ABSTRACT

Non-cylindrical conducting shapes are described in the context of multilayer laminated substrate cores. In one example a package substrate core includes a plurality of dielectric layers pressed together to form a multilayer core, a conductive bottom pattern on a bottom surface of the multilayer core, and a conductive top pattern on a top surface of the multilayer core. At least one elongated via extends through each layer of the multilayer core, each elongated via containing a conductor and each connected to a conductor of a via in an adjacent layer to electrically connect the top pattern and the bottom pattern through the conductors of the elongated vias.

20 Claims, 6 Drawing Sheets

NON-CYLINDRICAL CONDUCTING SHAPES IN MULTILAYER LAMINATED SUBSTRATE CORES

FIELD

The present disclosure relates to conductive vias in substrates and, in particular, to elongated vias in multilayer cores.

BACKGROUND

A semiconductor die package uses a package core to hold one or more dice and a cover to protect the die or dice from the contaminants and impact. The die inside the package is mounted to a core or a substrate. The package core can provide stiffness and structure to the package. The package core may also provide thermal heat dissipation, power delivery and signal integrity benefits, depending on the particular package type and its application.

In cored packages electrical paths are needed from one side of the core (die side) to the other (board side). The core or substrate includes conductive paths so that the die can make electrical connections on one side of the core though the core to the outside of the package and connect to a printed circuit board or some other substrate, material, or device for power and data signals. The core may also provide a geometric transformation from the compact electrical contact configuration of a silicon die to the larger scale of the contacts on a printed circuit board that the package is mounted on.

Cylindrical, plated, filled, and plugged through holes are used to transfer power and signals through package cores. There are a variety of different types of conductive paths used with different types of package substrates and cores. The different paths have different benefits and include PTHs (Plated Through Holes), and LTHs (Laser Through Holes), among others.

As semiconductor dies become smaller and require more power, through holes or vias must carry more current or carry faster signals in less space at less cost to build. Faraday Cage-like structures have been shown for through holes, but they must be constructed as spaced apart PTHs. However, due to the large gaps between the PTHs, this structure requires a large area on the core and is rarely used in products.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Laser drilling and milling may be used to create a copper filled via or a copper filled non-cylindrical shape in an SVLC (Stacked Via Laminate Core) type core. The laser drilling or milling may be used to make specific shapes in an SVLC structure. Filled and non-cylindrical through-vias and shapes may be used for power delivery purposes and also for transmitting data signals. These shapes provide very good lateral resistance reduction as compared to standard cylindrical or conical vias. The described vias are particularly useful for providing high current density within layer-to-layer ACI (Air Core Inductor) transitions.

The described unique vias provide very good lateral resistance reduction. In many systems, power comes from the PCB (Printed Circuit Board) into a chip package near a corner or an edge of the package. There may be 50-150 pins on the package substrate attached to the PCB and arranged in lines leading toward the center of the package. Internal layers of the package substrate are used to laterally transfer power from this corner or edge area to a more central area underneath the die. However, the ability of the substrate to transfer power is fundamentally limited by how many layers are used for routing, ground, or other features. The amount of power transfer is increased using the SVLC core architecture because it allows more layers for use in power delivery. But even SVLC is fundamentally limited by the thickness of those layers.

By creating very low resistance paths through two or more SVLC core layers from the power corridor to the area under the die more power can be transferred. The thickness of the paths through the core and the electrical continuity from end to end of the power transmission vias allow the resistance of through silicon vias in a package to drop by 30-50%.

In one embodiment, a non-cylindrical copper filled three dimensional shape is implemented in a semiconductor substrate or a package, such as an SVLC-type core. Similar structures may be formed in layers of other types of multilayer cores and substrates.

Figure 1:
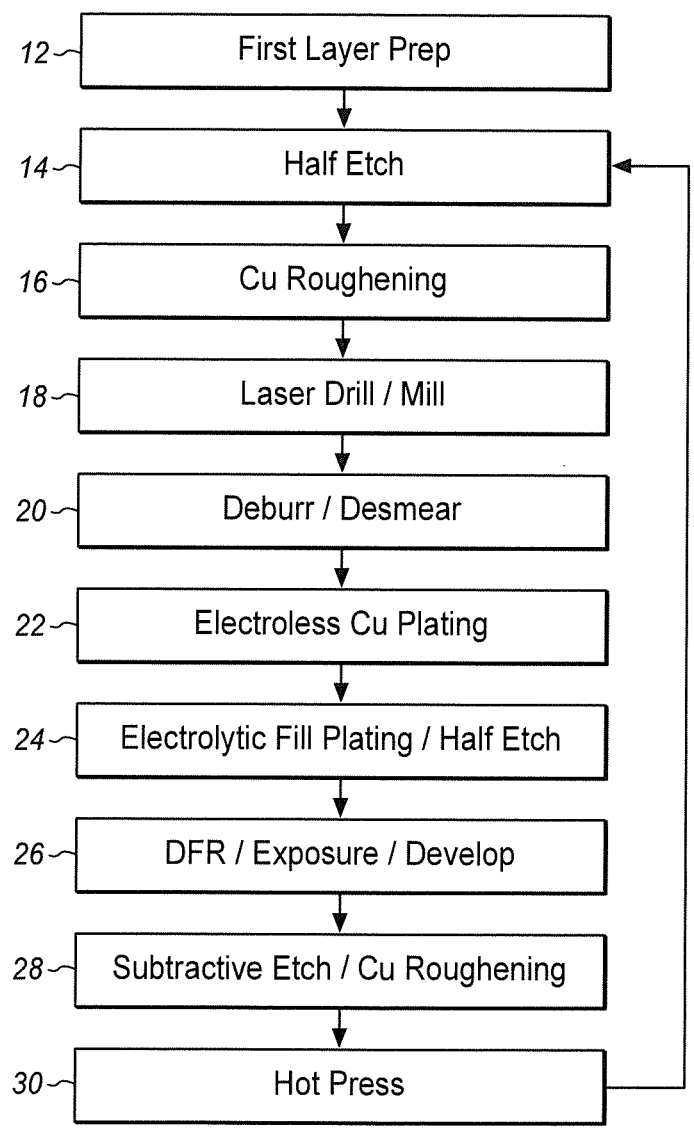
FIG. 1 is a process flow diagram of forming an elongated via in layers of a multilayer package substrate according to an embodiment of the invention.

FIG. 1 is a process flow diagram of forming non-cylindrical holes in package substrate or core that is formed from multiple layers. As shown in FIG. 1, an initial core layer with an incoming copper foil of 12 μm goes through a half etch step at 14 to etch away a few microns of copper to a lower thickness for laser drill machines with lower power. For higher power machines, the half etch operation is optional and the thicker copper is drilled through. The initial layer may be coated with copper on one or both sides. Other conductive materials may be used instead of copper, such as aluminum, metal alloys, and various carbon or graphite compounds.

At 16 a copper etch is applied as copper roughening to increase the absorption energy of the laser that will later be used for drilling vias. A black oxide or other copper roughening treatment can be used for roughening the copper. Depending on the roughening treatment that is applied and the condition of the soft etch pre-treatment step in the black oxide process, 2-3 μm may be removed following these preparation processes.

At 18, the substrate is laser drilled to ablate core material in such a way as to form non-cylindrical vias or holes in the core layer without drilling or milling through the copper on the opposite side of the layer. The drilling is controlled in depth by controlling the power, duration and the number of shots in the laser drilling.

At 20, following the formation of the non-cylindrical via or conductive path by laser drilling, any recast material on the rim of copper around the surface shape of the via may be removed with a deburring process. Deburring may also be used to remove any overhanging copper on the core material. When a desmear is used, the deburring may be performed either prior to or after desmear. If the via is first desmeared, then deburred, then the overhang will be increased. This may be caused following desmear due to the etch back of the core resin material of the substrate. The deburr treatment may remove another 2-3 µm of copper from the surface in the process of removing the copper overhang and nodules formed from the recast material.

After a deburr process which is optional, a normal desmear may be applied. This may be followed at 22 by an electro-less copper plating process. This plating process may be the same as or similar to normal via filling processes.

With the plating finished, copper plating may be applied electrolytically at 24. Electrolytic copper plating may use multiple plating steps to fill the via or hole that was created by the drilling with copper. The copper plating may be done as a sequence of operations. The first of which may be flash plating which increases the thickness of plated copper in the hole. In some embodiments, there may be about 1 µm more copper in the hole after electro-less copper plating. The flash plating enhances the conductivity of the seed layer.

After the flash plating, a high copper concentration and low acid concentration may be applied to the hole to provide more copper to fill the hole. There are several factors that may be balanced to improve the filling process for particular implementations. These include the preceding operations, the chemistry and equipment of the filling process, and the design layout and dimensions of the non-cylindrical holes that are to be filled. If the core layers are made from glass-reinforced epoxy resin or similar materials, then the laser conditions for drilling the holes influences the amount of the glass cloth protrusion from the substrate into the holes and how smooth and regular the wall shape becomes. The desmear process may also be optimized to avoid etching and to increase the glass fiber protrusion distance. This is because the rate of resin etching is much higher than that of the glass fiber.

To ensure sufficient electrical connectivity over the surface and in the holes, the electro-less copper plating may also provide uniform coverage for the copper across the surface and inside the holes. The uniformity is influenced by the solution agitation, the current waveform used to cause the plating, and the composition of the plating solution. Higher solution flow and turnover may provide a better solution exchange in the through hole, which helps to deliver the necessary supply of copper ions into the hole for filling and suppressing or leveling additives on the sidewall. This may achieve a bottom up filling mechanism.

If the core layer, e.g. an SVLC layer, is particularly thick or the drilled holes are particularly small and deep, then there may be a risk of forming voids while filling. The solution chemistry may include a very strong leveling additive to suppress growth at the corners and sidewalls of the holes so that the holes can be filled with copper before the hole mouth or another location in the hole is closed off. Since the leveler has reduced effect up to a certain current density, staying close to that current density at the early stages of the filling process helps to keep the mouth of the hole open. Once the hole reaches a point where a shallower depth remains for filling, a more aggressive current waveform may be applied with a higher confidence of filling the rest of the hole without inclusions. The more aggressive waveform may include periodic pulse plating to reduce the thickness of over plated copper on the surface and to reduce the diffusion boundary layer at the higher current densities.

The dimensions of the non-cylindrical holes affect the current density and the plating time to apply. Higher aspect ratio holes require longer filling times and lower current densities to effectively fill the hole without forming large voids by closing over the hole mouth before the entire hole can be filled. Even low aspect ratio features can require longer filling times depending on the overall dimensions of the non-cylindrical shape since very large features require a very large amount of copper to fill the hole. Depending on the design layout with respect to pitch and density, it is possible that when a uniform process is applied, certain areas may have better filling and thicker over plated copper than other areas of the same surface.

Depending on the plating step that is being used and the shape or design layout that is being filled, a half etch process may optionally be used to etch away some of the over plated copper to the targeted thickness on the layer. If the feature to fill is extremely wide, the recess of the filled hole may become large enough where grinding may work better than etching for removing some of the over plated copper and reducing the recess.

When forming through holes in an SLVC architecture, some patterning of the initial core layers may be desired. To form these patterns after the through holes are formed, at 26 the initial core layer may have resist applied to it, be exposed with the desired pattern, and have the resist developed. For the first or initial one or few layers of an SVLC through holes may be formed. Because the initial layer is hot-pressed-up the vias may go completely through the first layer. For subsequent layers, the vias would likely go down only to the nearest underlying copper layer. These are not through holes but drilled vias with a carefully controlled depth. The variety of different controls mentioned above for the laser drilling process allows the depth of the drilling to be well controlled.

At 28 a desired pattern in the copper may be formed with a subtractive etch step removing the undesired copper and exposing the underlying pre-preg (pre-impregnated composite fiber layer) on both sides of the initial core layer. This patterning may provide conductive paths on the core layer to make connections between vias. The patterning may also be used to provide heat conduction paths to conduct heat away from the center of the layer. Cooling paths may be used to cool the substrate or to cool a die that eventually will be attached to the substrate.

At 30 the copper may again be roughened before the next SVLC layers (pre-preg coated with copper on one or both sides) are hot pressed to both sides of the initial core layer.

All of the operations described above may then be repeated starting with the half etch 14. Again, the laser power may be adjusted to only ablate the surface copper and the core layer material exposing the underlying copper. As shown, each layer is drilled and patterned individually in order to form a pattern of non-cylindrical vias or slot vias. Depending on the design of the core and the nature of the layers, two or more layers may be hot pressed together, then glued and patterned. Two or more layers are then laminated onto the initial two layers and the two new layers are drilled and patterned until the complete core has been built up.

The vias of different layers are connected together when the layers are laminated together, for example by hot pressing. The vias may connect directly by being vertically aligned through the layers or may be connected by the copper patterning developed at 26, 28. When enough layers have been pressed together, then the resulting laminated core is further processed for use as a package substrate.

The design rules for forming non-cylindrical copper filled holes may be modified to suit particular applications. Holes that extend beyond more than two layers of the SVLC type core may require special consideration. The holes need not extend through the entirety of the SVLC architecture core, however. The hole size and shape may also be adjusted to suit the registration and alignment capability of the laser equipment being used in the process.

Figure 2:
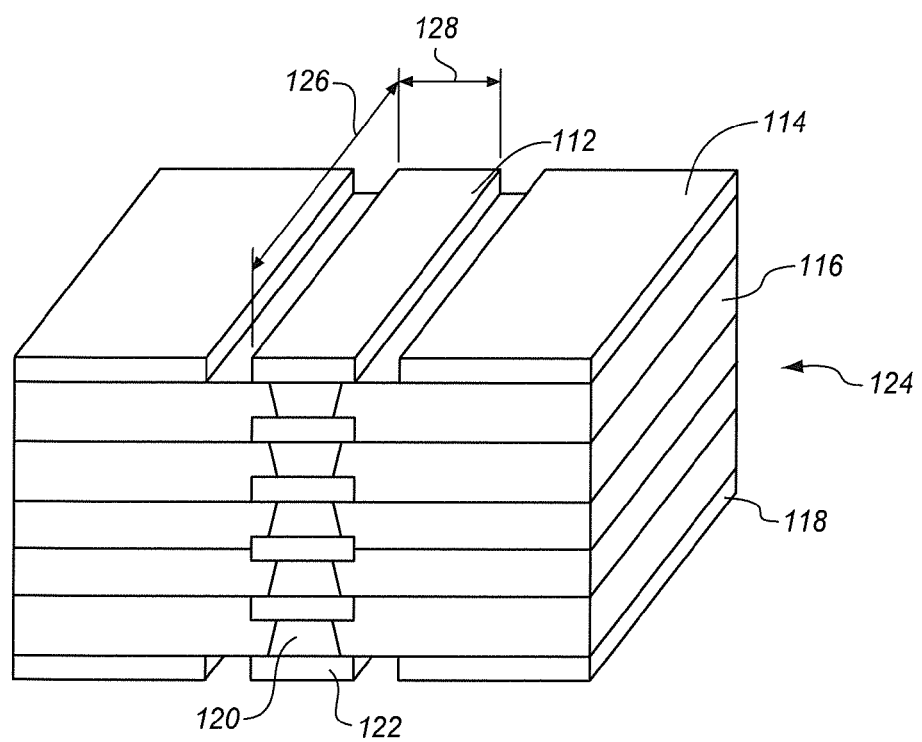
FIG. 2 is a cross-sectional diagram of a multilayer package substrate having an elongated via according to an embodiment of the invention.

FIG. 2 is a perspective diagram of a part of patterned SVLC core. A top part of a non-cylindrical slot or hole 112 has been formed in the top layer 114 of an SVLC 124. In this case, the elongated hole is represented as straight and extending into the page. The elongated hole need not be straight and need not extend through all layers 116 of the SVLC type core 124 as shown. Using laser milling or drilling any etch patterning any of a variety of different shapes can be created.

The core 124 or substrate which may be an SVLC or other type of laminated core that includes multiple layers, in this case five, of fiberglass pre-preg 116 that are between a conductive top 114 and bottom 118 layer. Conductive layers (not shown) may be present between one or more of the other intermediate layers. More or fewer layers may be used depending on the particular implementation. The elongated hole has been drilled through each layer to form a via 120 from top 112 to bottom 122. In this case all of the elongated vias are aligned to form a vertical structure through the SVLC, however, at any one layer, the conductor may translate across the layer to a different position within the core.

The top conductor layer 114, the bottom conductor layer 116, and the via 120 may be copper or another conductive material, such as aluminum, other metals, metal alloys, and carbon materials. The core layers 116 are typically dielectric, such as polymers like cured resin and epoxy, or specifically a fiberglass pre-preg. The via may be plated or filled with copper or another conductor. It has a length 126 greater than its width 128. The elongated via shape allows more current to be carried than through a conventional via with a circular cross-section. The depth of the via will depend upon the depth of the layer of the core in which the via has been milled. While only one via is shown, in practice, a package substrate will have hundreds of elongated vias to connect outer pins (not shown) to inner pads (not shown) of the package substrate 124.

Figure 3A:
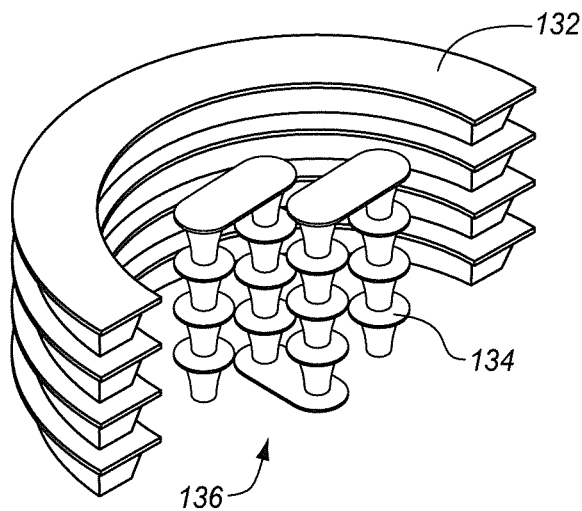
FIG. 3A is a perspective view diagram of elongated conductive structures according to an embodiment of the invention.

FIG. 3A shows a portion of an elongated via in a perspective view in which a VSS shield 132 has been formed. The shield may provide noise isolation, signal isolation, or both. The configuration of a shield structure surrounding conductive vias may also be used as a coaxial conductor for DC, AC or differential current or signals. The via is shown in perspective view partially cut away and with the layers and dielectric removed so that only the metal structures are visible. The shield 132 is formed of in this example, four layers of drilled channels. A metal layer has been plated over the surface of the drilled channels and filled in with more metal. As the four core layers are laminated together, the shield acquires a height and a shape as shown. The top and bottom layers may be formed from top and bottom copper layers on the initial and final core layers or they may be formed by drilling and filling.

Multiple vertical vias 134 have been formed in a central area 134 enclosed by the VSS shield. The vias may be used to form an inductor coil to enhance power transmission through the structure. The signals in the vias central area are shielded from any other signals in the substrate by means of the via which is tied to a voltage, such as VSS. The shield 132 may be formed as a semi circle to shield the vias from a portion of the other structure in the substrate, or the semi circle may be just a part of a larger structure that fully surrounds the vias.

Figure 3B:
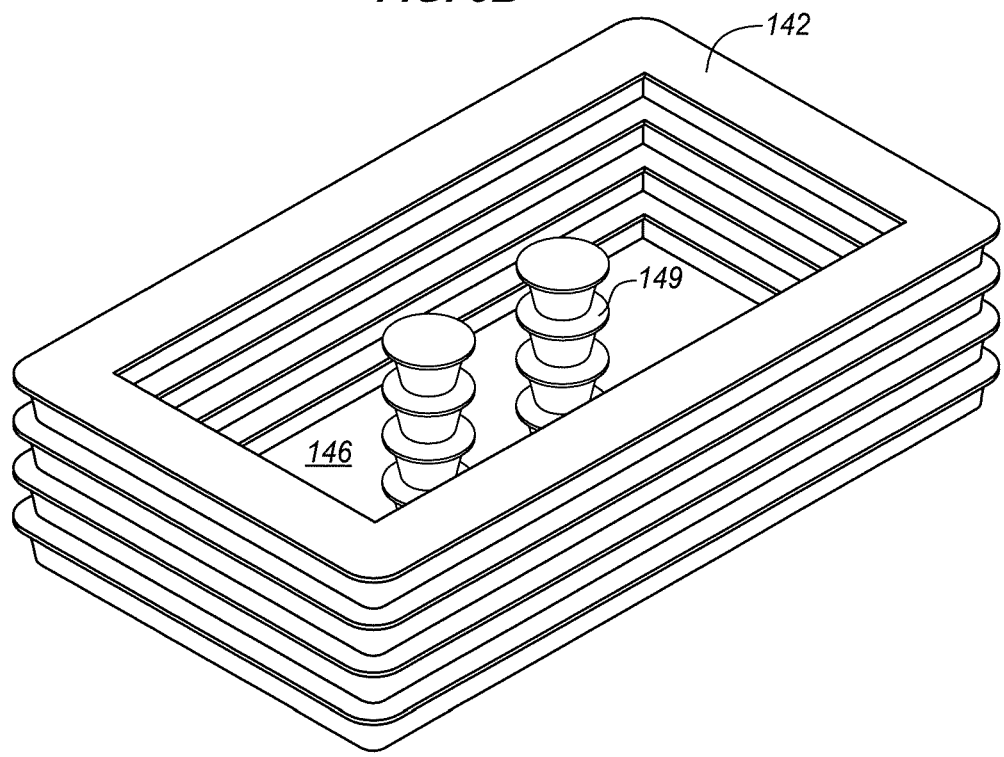
FIG. 3B is a perspective view diagram of elongated conductive structures according to an embodiment of the invention.

FIG. 3B shows an alternative configuration in which channels 142 have been drilled to form a rectangular shape. A pair of vias 144 have been formed within the area 146 enclosed by the channels so that the vias are completely enclosed by the channels. Two vias may be used to form a differential pair for signaling, or for a differential DC voltage. The rectangular channels form a shield so that high frequency signals running through the differential pair have less interference and noise from other structures.

Figure 4A:
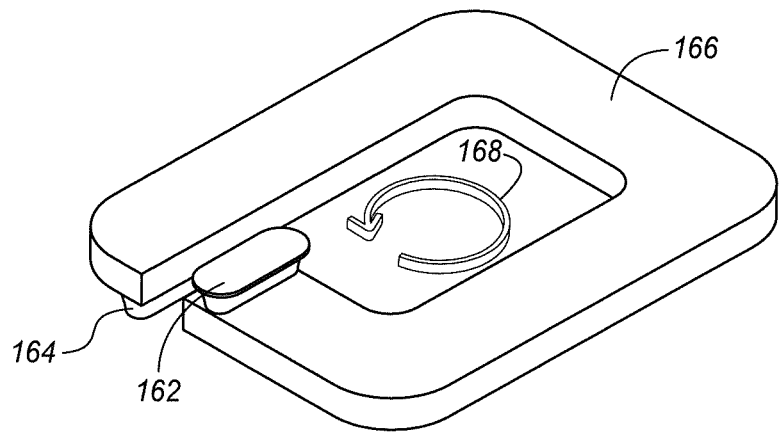
FIG. 4A is a perspective view diagram of a conductive coil inductor connecting two elongated vias according to another embodiment of the invention.

While two possible channels shapes are shown that may be created using the processes described herein, a wide variety of other shapes and forms may be created. VSS shields are particularly useful FIG. 4A is a diagram of copper structures between two pre-preg layers of an SVLC. The pre-preg and any dielectric have been removed to show the copper structure more clearly. A slot via 162 extends from above and connects to a copper pattern 166 between two core layers. The copper structure is in the form of an ACI (Air Core Inductor) loop which may be part of a larger ACI. This is an inductor with coils in the package and even in the SVLC. It is not a strictly an air core because the core of the inductor is not filled with air but instead with the dielectric package material. The loop 166 connects the slot via 162 from upper layers to a second slot via 164 that extends from the loop to lower layers. The slot vias are not aligned and do not connect except through the loop. The loop connects the two upper 162 and lower 164 vias and generated current flow around the loop. For current flow from upper layers to lower layers, an arrow 168 shows the direction of the current flow. The slot vias are shown as having an elongated via shape that extends radially across the loop. This allows for better current flow and higher reliability for the connection between the slot vias and the ACI loop.

Figure 4B:
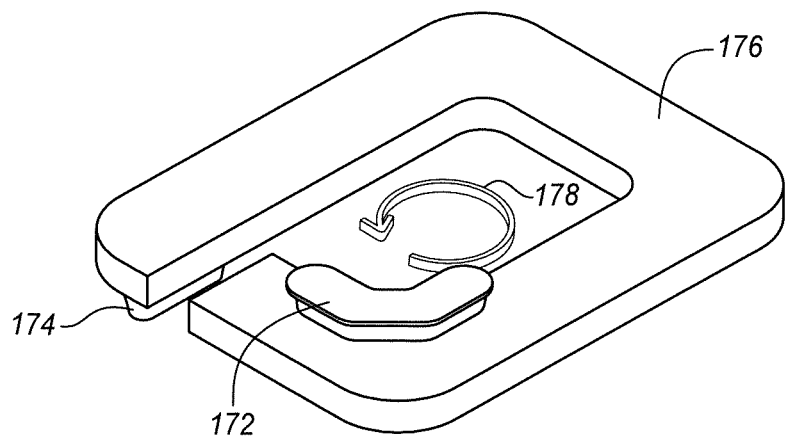
FIG. 4B is a perspective view diagram of a conductive coil inductor connecting two elongated vias according to another embodiment of the invention.

FIG. 4B is another diagram of a copper structure between two pre-preg layers of an SVLC. The connection is between a slot via 172 from upper layers and a slot via 174 to lower layers. An ACI loop connects the two vias as in the example of FIG. 4A. The two vias are not aligned horizontally and so they are connected only through the loop. The upper slot via 172, that is the slot via that connects the loop to a copper pattern in an upper layer, is elongated along the loop. This direction is perpendicular to the radial direction of the elongation of the via in FIG. 4A. As compared to the radial elongation of the via, the via of FIG. 4B is elongated in a tangential direction. However because the loop has thick cross-section, the tangential and radial elongation are completely within the surface of the loop. This is not necessary, however, the thicker loop and the elongated via allow for more current flow. In addition, because the loop is not circular but rectangular in shape the tangential elongation is collinear with one of the four sides of the loop and completely within the side, enhancing current flow.

These configurations may provide for massive local current density. The elongated replacement for the vias, allows much more even current distribution. The ACI loop thickness is shown as being between two core layers but may extend beyond one SVLC layer. While only two variations of elongated via slots are shown as replacing the two individual cylindrical vias, a wide variety of other variations may similarly be used.

Figure 5:
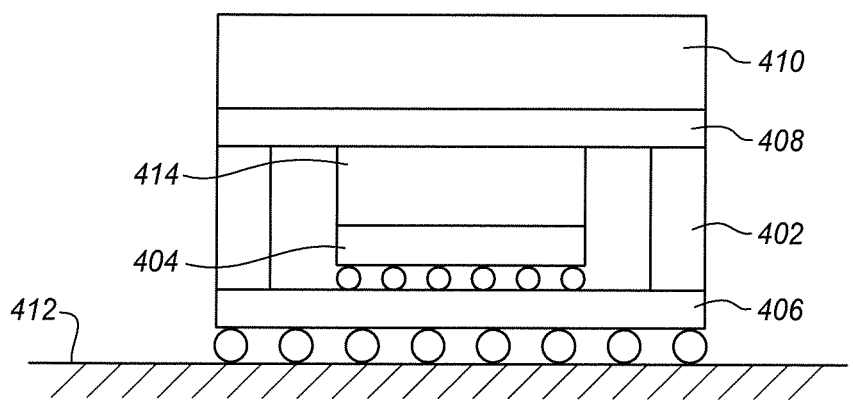
FIG. 5 is a cross-sectional diagram of a packaged die wherein the package substrate includes elongated vias according to an embodiment of the invention.

FIG. 5 is a cross-sectional diagram of a package having a package substrate with elongated vias and a die according to one embodiment. The conductive vias and other conductive pathways of the multilayer substrate are not visible in this view. The die may be attached to the substrate using solder balls as shown or in any of a variety of other ways. The die is sealed against the external environment with sealant sidewalls 402 that surround the die and typically are plastic or ceramic. A cover 408 attaches to the top of the sealant, in this case in the form of an integrated heat spreader. The cover is attached to the die using a thermal interface material 414 such as a polymer or a metal that serves to adhere the die to the integrated heat spreader. Sealing and heat spreading may not be used in all cases. The die may be a processor, a controller, or any other type of semiconductor or micromechanical device.

A cooling system 410 is then typically attached to the heat spreader to cool the die when in use. The cooling system, in some cases a heat sink 410, is attached to the package. The cooling system may be heat fins, fans, heat pipes, a cooling fluid system or any other suitable cooling system depending on the particular application for the die and package.

Figure 6:
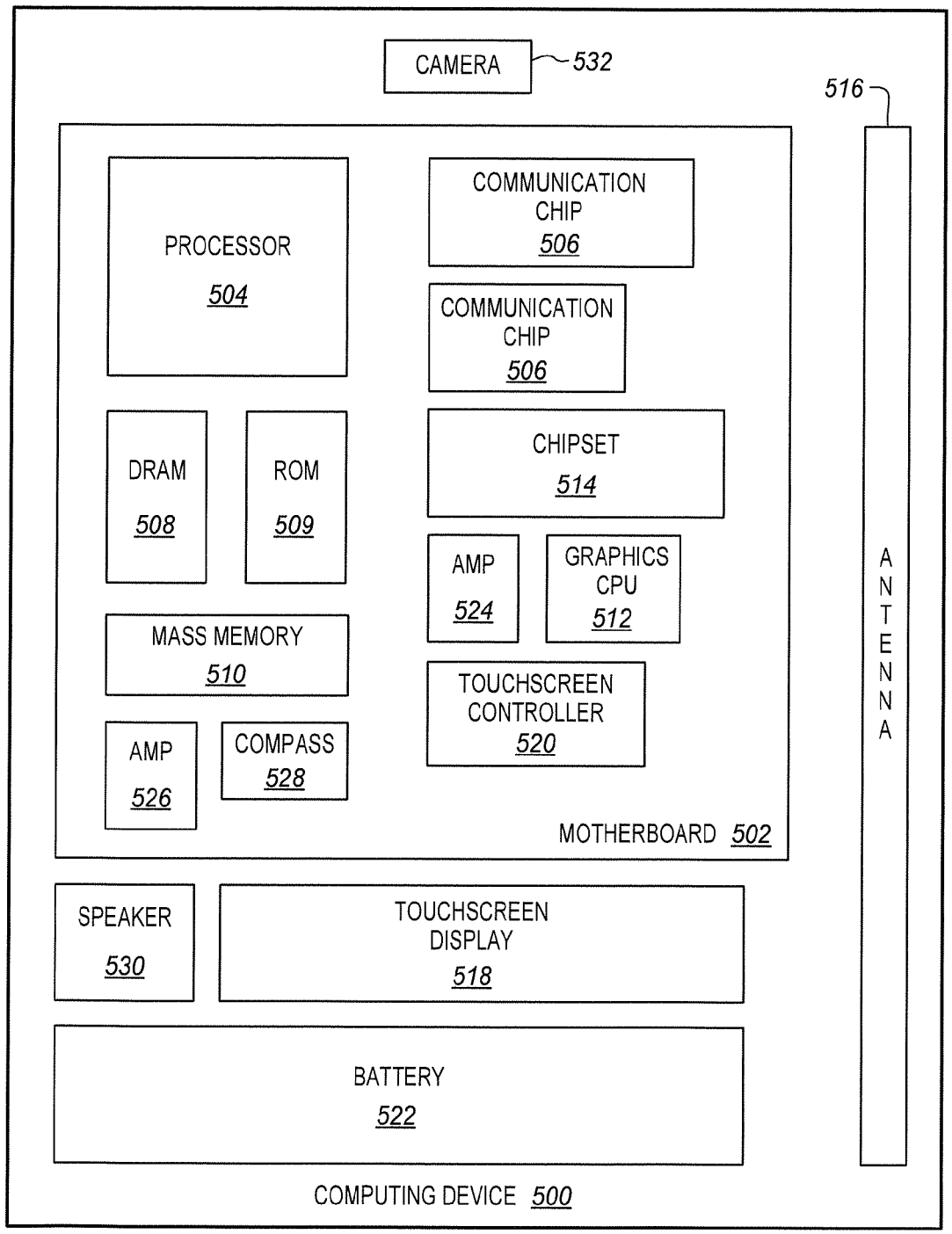
FIG. 6 illustrates a computing device 500 in accordance with an embodiment of the invention.

Packaged between the substrate and the cover, the die may be attached through the substrate to a printed circuit board 412 of a device such as that of FIG. 6 for any of a variety of different uses. The board connects the packaged die to other components for power, input, output, and other interconnections. The package may also have other connections for test or use separate from the board. The substrate translates the solder ball connection points of the die to the solder ball connection points of the printed circuit board. The diagram of FIG. 5 is provided for context to show attachment to a substrate. The approaches described above may be used with a wide variety of different substrate and package designs including flip chip packages. The package may be attached directly to a board or it may be attached to a socket or wire connector, depending on the implementation. While the multilayer laminated substrate is shown with a single packaged die, the invention is not so limited. The die may be packaged with additional dies. The die may be retained or protected in any of a variety of other ways.

FIG. 6 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM) 508, non-volatile memory (e.g., ROM) 509, flash memory (not shown), a graphics processor 512, a digital signal processor (not shown), a crypto processor (not shown), a chipset 514, an antenna 516, a display 518 such as a touchscreen display, a touchscreen controller 520, a battery 522, an audio codec (not shown), a video codec (not shown), a power amplifier 524, a global positioning system (GPS) device 526, a compass 528, an accelerometer (not shown), a gyroscope (not shown), a speaker 530, a camera 532, and a mass storage device (such as hard disk drive) 510, compact disk (CD) (not shown), digital versatile disk (DVD) (not shown), and so forth). These components may be connected to the system board 502, mounted to the system board, or combined with any of the other components.

The communication chip 506 enables wireless and/or wired communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor, memory devices, communication devices, or other components include one or more dies that are adhered to a metal plate to resist warpage. The term "processor" may refer to any device or portion of a device that processes electronic data from registers and/or memory to transform that electronic data into other electronic data that may be stored in registers and/or memory.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to an apparatus such as a package substrate core that comprises a plurality of dielectric layers pressed together to form a multilayer core, a conductive bottom pattern on a bottom surface of the multilayer core, and a conductive top pattern on a top surface of the multilayer core. At least one elongated via extends through each layer of the multilayer core, each elongated via containing a conductor and each connected to a conductor of a via in an adjacent layer to electrically connect the top pattern and the bottom pattern through the conductors of the elongated vias.

Further embodiments comprise at least one conductive path between a first and a second layer of the multilayer core to connect the conductor in the elongated via of the first layer to the conductor in the elongated via of the second layer. In further embodiments, the conductive path is a loop inductor, or the conductive pattern, and the conductor contained in each elongated via is formed of copper.

Further embodiments comprise a drilled channel proximate the conductor of an elongated via in at least one layer, the drilled channel being filled with conductive material.

In further embodiments, the conductive material is coupled to a voltage to provide an isolation shield for the conductor, or the drilled channel is separated from the elongated via by a dielectric, the conductor carries data signals, or the conductor carries power for a die attached to the core, or the elongated vias are formed by drilling.

Some embodiments pertain to a method that comprises forming a first elongated via through a first layer of a multilayer package substrate core, filling the first elongated via with a conductive material, patterning conductive connectors on a first side of the first layer, and pressing a second side of the first layer opposite the first side of the first layer to a second layer of the multilayer package substrate core. The method further comprises forming a second elongated via through the second layer, filling the second elongated via with the conductive material, and connecting the second elongated via to the patterned conductive connectors through the first elongated via.

In further embodiments, forming a first elongated via comprises laser drilling the first layer to form the first elongated via, and filling comprises plating walls of the first elongated via and then filling the first elongated via.

In further embodiments, the first layer comprises a metal coating on the second side and wherein forming comprises laser drilling through the second side. Further embodiments comprise roughening the metal coating before laser drilling.

In some embodiments, a semiconductor device comprises a semiconductor die, a substrate including a multilayer core attached to the semiconductor chip; and at least one elongated via through each layer of the multilayer core, each elongated via containing a conductor and each connected to a conductor of a via in an adjacent layer to electrically connect the semiconductor die to a bottom conductive pattern of the core through the conductors of the elongated vias.

Further embodiments comprise loop inductors between layers of the multilayer core. In further embodiments a package cover is attached to the substrate and covers the semiconductor die.

What is claimed is:

1. A package substrate core configured to carry and connect with at least one semiconductor die, the package substrate core comprising:
    a plurality of dielectric layers to form a multilayer core;
    a conductive bottom pattern on a bottom surface of the multilayer core;
    a conductive top pattern on a top surface of the multilayer core to connect with the die;
    at least one elongated via, the via having a depth through each layer of the multilayer core, the via being elongated to have a length in each layer that is greater than its width in the respective layer so that it does not have a circular cross-section and is an electrical isolation shield through the multilayer core for other conductive vias, each elongated via containing a conductor and each elongated via connected to a conductor of a via in an adjacent layer to electrically connect the top pattern and the bottom pattern through the conductors of the elongated vias,
    wherein the at least one elongated via comprises four layers of vias, the isolation shield having a height and a width through the multilayer core when the layers are laminated together and a curve to form a semi-circle through the layers of the multilayer core.

2. The package substrate core of claim 1, further comprising at least one conductive path between a first and a second layer of the multilayer core to connect the conductor of the elongated via in the first layer to the conductor of the elongated via in the second layer.

3. The package substrate core of claim 2, wherein the conductive path is a loop inductor.

4. The package substrate core of claim 1, wherein the conductive top pattern, the conductive bottom pattern, and a conductor contained in each elongated via is formed of copper.

5. The package substrate core of claim 1, further comprising a channel proximate an elongated via in at least one layer, the channel being filled with conductive material.

6. The package substrate core of claim 5, wherein the conductive material is coupled to a voltage to provide an isolation shield for the conductor contained in each elongated via.

7. The package substrate core of claim 6, wherein the via conductor carries data signals.

8. The package substrate core of claim 5, wherein the channel is separated from the elongated via by a dielectric.

9. The package substrate core of claim 1, wherein the via conductor carries power for a die attached to the core.

10. The package substrate core of claim 1, wherein the elongated vias are formed by drilling.

11. The package substrate core of claim 1, wherein the multilayer core is an SVLC (Stacked Via Laminate Core) type core.

12. The package substrate core of claim 1, wherein the at least one elongated via comprises a first upper elongated via connected to upper routing layers of the multilayer core, a second lower elongated via connected to lower routing layers of the multilayer core, and a third elongated via between the upper and the lower vias, the third elongated via comprising multiple layers of drilled vias to form a loop having a height and a width through the multilayer core.

13. A semiconductor device comprising:
   a semiconductor die;
   a substrate including a multilayer core having a plurality of dielectric layers, the substrate being attached to the semiconductor die; and
   at least one elongated via, the via having a depth through each layer of the multilayer core, the via being elongated to have a length in each layer that is greater than its width in the respective layer so that it does not have a circular cross-section and is an electrical isolation shield through the multilayer core for other conductive vias, each elongated via containing a conductor and each elongated via connected to a conductor of a via in an adjacent layer to electrically connect the semiconductor die to a bottom conductive pattern of the core through the conductors of the elongated vias,
   wherein the electrical isolation shield surrounds the other conductive vias and the isolation shield and the surrounded conductive vias are coupled to a current source as a coaxial conductor.

14. The semiconductor device of claim 13, the substrate further comprising loop inductors between layers of the multilayer core.

15. The semiconductor device of claim 13, further comprising a package cover attached to the substrate and covering the semiconductor die.

16. A package substrate core configured to carry and connect with at least one semiconductor die, the package substrate core comprising:
   a plurality of dielectric layers to form a multilayer core;
   a conductive bottom pattern on a bottom surface of the multilayer core;
   a conductive top pattern on a top surface of the multilayer core to connect with the die;
   at least one elongated via, the via having a depth through each layer of the multilayer core, the via being elongated to have a length in each layer that is greater than its width in the respective layer so that it does not have a circular cross-section and is an electrical isolation shield through the multilayer core for other conductive vias, each elongated via containing a conductor and each elongated via connected to a conductor of a via in an adjacent layer to electrically connect the top pattern and the bottom pattern through the conductors of the elongated vias,
   wherein the electrical isolation shield surrounds the other conductive vias and the isolation shield and the surrounded conductive vias are coupled to a current source as a coaxial conductor.

17. The package substrate core of claim 16, further comprising at least one conductive path between a first and a second layer of the multilayer core to connect the conductor of the elongated via in the first layer to the conductor of the elongated via in the second layer.

18. The package substrate core of claim 16, wherein the conductive path is a loop inductor.

19. The package substrate core of claim 16, further comprising a channel proximate an elongated via in at least one layer, the channel being filled with a conductive material coupled to a voltage to provide an isolation shield for the conductor contained in each elongated via.

20. The package substrate core of claim 16, wherein the via conductor carries power for a die attached to the core.

* * * * *